United States Patent [19]
Poppinger

[11] 3,962,631
[45] June 8, 1976

[54] CIRCUIT FOR DETERMINING A MEASURE VALUE OF A RECTIFIED A-C VOLTAGE

[75] Inventor: Herbert Poppinger, Erlangen, Germany

[73] Assignee: Siemens Aktiengesellschaft, Munich, Germany

[22] Filed: Nov. 29, 1974

[21] Appl. No.: 528,488

[30] Foreign Application Priority Data
Dec. 5, 1973  Germany.......................... 2360651

[52] U.S. Cl............................... 324/119; 321/8 R; 324/123 R
[51] Int. Cl.²..................... G01R 19/22; H02M 7/00
[58] Field of Search...................... 324/119, 123 R; 321/8 R

[56] References Cited
UNITED STATES PATENTS 2,198,226  4/1940  Peterson............................. 324/119
3,311,826  3/1967  Galman........................... 324/123 R Primary Examiner—R. V. Rolinec
Assistant Examiner—Ernest F. Karlsen
Attorney, Agent, or Firm—Kenyon & Kenyon Reilly Carr & Chapin

[57] ABSTRACT

A circuit for determining a measured value of a rectified a-c voltage of the type having at least one compensation diode for compensating the diode threshold values in the rectifier and which is connected in series therewith, in which the diode is connected in series with the same polarity as the rectifier diodes, a compensation resistor shunted by a voltage divider is connected in series with the compensation diode and an operational amplifier is connected in parallel to the diode and compensation resistor such that the desired compensation voltage always appears across the compensation resistor.

5 Claims, 2 Drawing Figures

CIRCUIT FOR DETERMINING A MEASURE VALUE OF A RECTIFIED A-C VOLTAGE

BACKGROUND OF THE INVENTION

This invention relates to circuits for measuring rectified a-c voltages in general and more particularly to an improved circuit which gives superior compensation at low voltage values.

When measuring a-c voltages it is customary to first rectify the voltage. When using semiconductor rectifiers measuring errors occur particularly near the zero point because of the threshold values or diode drops in the semiconductor used. Circuits for compensating these errors have been developed. Typically in such circuits additional diodes are connected in series and with a polarity opposite that of the diode of the rectifier. These additional diodes or compensating diodes are connected to an auxilliary voltage source and carry a current which is made to correspond as accurately as possible to the current in the rectifier elements of the rectifier. In addition to requiring a separate auxiliary voltage source circuits of this nature also require that current flowing through the compensation diodes must correspond to the current in the rectifier diodes as closely as possible. Such can be assured only through relatively difficult adjustment and balancing problems constituting a further disadvantage. Furthermore, compensation of the diode threshold measuring error is not possible over the entire measuring range using such circuits. A null error, for example cannot be avoided using the constant auxiliary voltage sources.

Thus, there is a need for an improved circuit of this nature in which measurement errors due to diode threshold values are eliminated to the greatest extent possible throughout all measuring ranges.

SUMMARY OF THE INVENTION

The present invention provides a circuit which solves this problem. The compensating diodes used are connected with the same polarity as the diodes in the rectifier. In series with the compensation diodes is a compensation resistor which is shunted by a voltage divider. An operational amplifier having an inverting input connected to the junction point between the rectifier and the compensation diodes and having a noninverting input connected to the center tap of the voltage divider and an output connected to the junction point between the compensation diode and the compensation resistor is provided. Using this circuit the previously required auxiliary voltage source is eliminated. In addition it is possible to provide compensation for the diode threshold value error over the entire measuring range while avoiding the previously required adjustment and balancing problems. The circuit can always be adjusted, regardless of the magnitude of the voltage measured, such that a voltage drop across the compensation resistor corresponding to the desired multiple of the threshold value voltages of the diodes used is present.

The number of compensation diodes used will preferably correspond to the number of series connected diodes in the rectifier. The elements of the voltage divider will preferably have equal resistance values. Using a circuit of this nature the measurement error due to the diode threshold values of the rectifier is doubled by the additional series connected diodes. Through the insertion of the operational amplifier into the circuit, the voltage drop at the compensation diode is first ascertained. If the resistances of the voltage divider are equal, then a voltage twice as large as the compensation diode drop is developed across the compensation resistor. Since the same current always flows through the compensation diodes as flows through the diodes of the rectifier it is possible to compensate the threshold value error of the diode over the entire measuring range, even in the vicinity of zero.

The output of the operational amplifier may be coupled through a diode which is poled in the same direction as the compensation diode with respect to a feedback path therethrough back to the inverting input.

DETAILED DESCRIPTION OF THE PREFERRED EMBODIMENT

Figure 1:
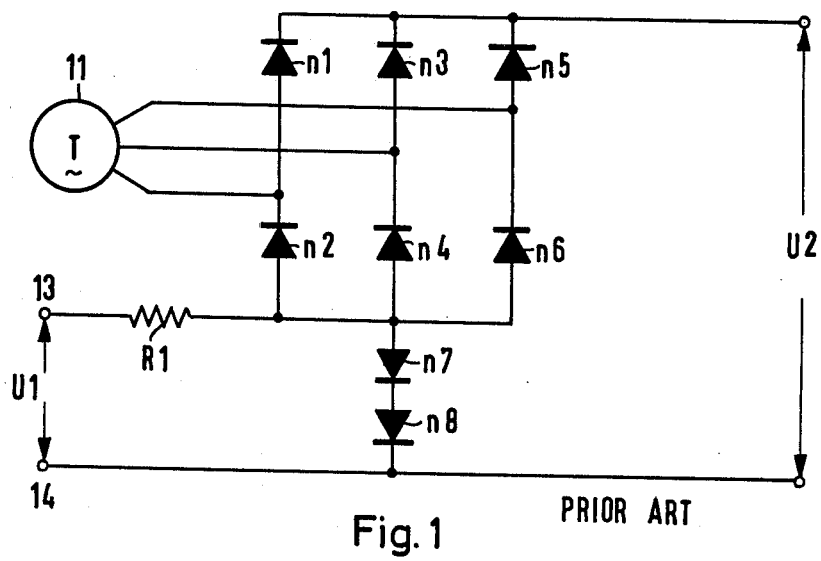
FIG. 1 is a circuit diagram of a typical prior art compensation circuit.

FIG. 1 illustrates a circuit diagram of a typical prior art compensation circuit. A voltage source 11, in the illustrated embodiment a three phase voltage source, such as a generator is illustrated. Coupled to the output of the voltage source 11 is a three phase rectifier bridge made up of diodes $n1$, $n2$, $n3$, $n4$ $n5$ and $n6$. In conventional fashion a d-c voltage will appear at the output of this rectifier, which d-c voltage is proportional to the a-c voltage input. Since the diodes in the rectifier have a threshold value error or diode drop error which will falsify the end result of the measurement of the a-c voltage, compensation is provided. To provide such compensation two diodes $n7$ and $n8$ are coupled to one side of the bridge. These diodes have a polarity opposite that of the diodes in the rectifier. As a result the direction of current flowing through these diodes will be opposite to that in the rectifier. To obtain a current flow through these diodes a separate voltage source is applied across the input terminals 13 and 14. This voltage source designated U1 is coupled through a resistor R1 across the diode $n7$ and $n8$. In medium voltage ranges it is possible through a relatively complex adjustment and balancing effort to make the auxiliary voltage source U1 such that the current flowing through the diodes $n7$ and $n8$ corresponds to a large extent to the current flowing in the diodes $n1$ through $n6$ of the rectifier. As a result the diodes $n7$ and $n8$ will each have a voltage drop approximately equal to the voltage drop in each of the diodes of the rectifier. The desired compensation is possible only in a limited range, however, when starting with a fixed auxiliary voltage source U1.

Figure 2:
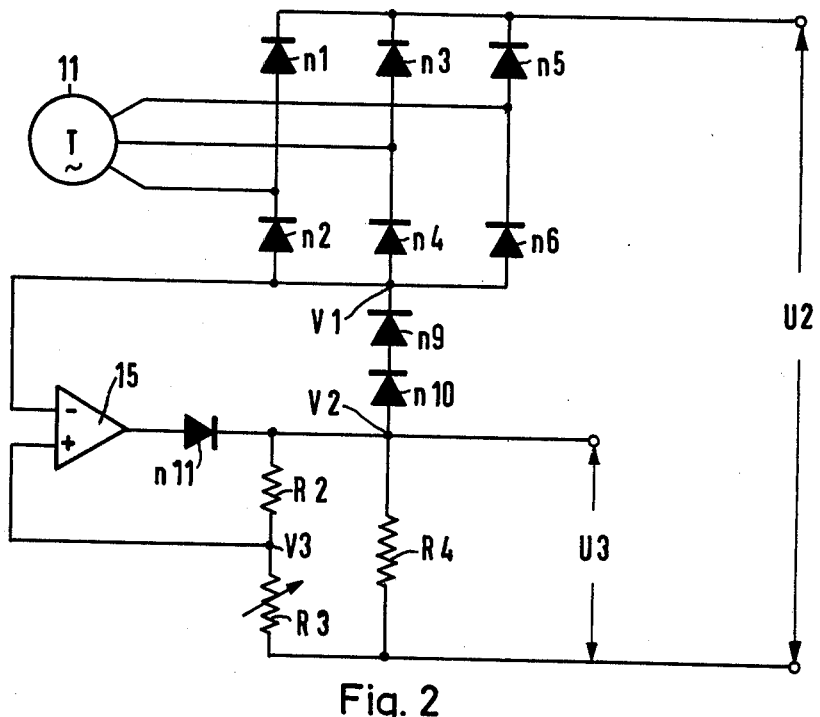
FIG. 2 is a circuit diagram of the circuit according to the present invention.

FIG. 2 is a circuit diagram illustrating the circuit of the present invention which overcomes the deficiencies present in the circuit of FIG. 1. Once again an a-c voltage source 11 has its output coupled to a three phase rectifier bridge comprising the diodes $n1$ through $n6$. For compensation purposes two further diodes $n9$ and $n10$ are connected in series with the rectifier bridge, the diodes $n9$ and $n10$ having the same polarity as the diodes in the bridge. Furthermore, in series with these diodes and the bridge, a compensation resistor R4 is installed. The inclusion of these additional two diodes $n9$ and $n10$ will initially result in a doubling of a diode threshold error. The circuit develops a voltage across the compensation resistor R4 which is equal to this doubled error and in an opposite direction thereby cancelling the error.

This voltage designated U3 is developed using an operational amplifier 15. In parallel with the resistor R4 is a voltage divider made up of the resistors R2 and R3. The junction point of these two resistors designated V3 is coupled to the noninverting input of amplifier 15. The inverting input of the amplifier 15 is connected to the junction point V1 between the compensation diodes $n9$ and $n10$ and the rectifier bridge. The amplifier output is provided through a further diode $n11$ to the junction point V2 between the compensation diodes and the compensation resistor R4. Diode $n11$, which is optional, has the same polarity as the diodes $n9$ and $n10$ with reference to the feedback path from the output of the amplifier 15 to its inverting input. The resistors R2 and R3, of which R3 is a variable resistor will be nominally set at the same value with trimming of the circuit accomplished by adjustment of resistor R3.

If the voltage drop across the diode which causes a measurement error is designated and $Ud$ and the voltage across the compensation resistor R4 is designated U3 it can be seen that the illustrated circuit, with R2 equal to R3, will provide a voltage U3 across the resistor R4 which is equal to $-4Ud$. This result is independent of the actual current flowing through the diodes. Thus, in all cases the relationship $U3 = -4Ud$ holds. The sign of the voltage developed is opposite to that of the voltage drop at the diodes. Thus, proper compensation which will also be effective for compensating the threshold value error of the diodes in the vicinity of zero is obtained.

Thus an improved circuit for measuring rectified a-c voltages has been shown. Although a specific embodiment has been illustrated and described, it will be obvious to those skilled in the art that various modifications may be made without departing from the spirit of the invention which is intended to be limited solely by the appended claims.

What is claimed is:

1. A circuit for determining the measured value of a rectifier a-c voltage utilizing at least once compensation diode for compensating the diode threshold values in the rectifier, the compensation diode connected in the series with the rectifier, comprising:
   a. at least one compensation diode connected in series with the rectifier with the same polarity as the rectifier diodes;
   b. a compensation resistor in series with said compensation diode;
   c. a voltage divider comprising two resistors in parallel with said compensation resistor; and
   d. an operational amplifier having its inverting input coupled to the junction between the rectifier and the compensation diode, its noninverting input coupled to the center tap of said voltage divider and its output coupled between the compensation diode and the compensation resistor.

2. The circuit according to claim 1 wherein the number of compensation diodes corresponds to the number of the series connected diodes in the rectifier and wherein the two resistors of said voltage divider have essentially equal resistances.

3. The circuit according to claim 1 and further including in the output of said operational amplifier a further diode which is connected in the feedback circuit of the inverting input of the operational amplifier in the same sense as said compensation diodes.

4. The circuit according to claim 2 and further cluding in the output of said operational amplifier a further diode which is connected in the feedback circuit of the invertinput of the operational amplifier in the same sense as said compensation diodes.

5. The circuit according to claim 4 wherein one of said two resistors is variable.

* * * * *